US012049698B2

(12) United States Patent
Xavier et al.

(10) Patent No.: US 12,049,698 B2
(45) Date of Patent: *Jul. 30, 2024

(54) SYSTEMS AND METHODS FOR REDUCING EFFLUENT BUILD-UP IN A PUMPING EXHAUST SYSTEM

(71) Applicant: Lam Research Corporation, Fremont, CA (US)

(72) Inventors: Antonio Xavier, Mulino, OR (US); Steven Goza, Beavercreek, OR (US); Ramesh Chandrasekharan, Portland, OR (US); Adrien Lavoie, Newberg, OR (US); Joseph Nesmith, Dundee, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/737,121

(22) Filed: May 5, 2022

(65) Prior Publication Data

US 2022/0259725 A1 Aug. 18, 2022

Related U.S. Application Data

(63) Continuation of application No. 15/263,838, filed on Sep. 13, 2016, now Pat. No. 11,332,824.

(51) Int. Cl.
*C23C 16/44* (2006.01)
*C23C 16/455* (2006.01)
(Continued)

(52) U.S. Cl.
CPC ...... *C23C 16/4405* (2013.01); *C23C 16/4408* (2013.01); *C23C 16/4412* (2013.01);
(Continued)

(58) Field of Classification Search
CPC ............ C23C 16/4405; C23C 16/4408; C23C 16/4412; C23C 16/50
See application file for complete search history.

(56) References Cited

U.S. PATENT DOCUMENTS

| 5,879,139 A | 3/1999 | Hayashi et al. |
| 6,045,618 A | 4/2000 | Raoux et al. |
| (Continued) |

FOREIGN PATENT DOCUMENTS

| KR | 20040008873 A | 1/2004 |
| KR | 20090001030 A | 1/2009 |
| (Continued) |

OTHER PUBLICATIONS

Korean Office Action for Korean Application No. KR10-2017-0110755 dated Oct. 18, 2021.

*Primary Examiner* — Dah-Wei D. Yuan
*Assistant Examiner* — Kristen A Dagenais

(57) ABSTRACT

A method for reducing effluent buildup in a pumping exhaust system of a substrate processing system includes, during a substrate treatment process, arranging a substrate on a substrate support in a processing chamber; supplying one or more process gases to the processing chamber; supplying an inert dilution gas at a first flow rate to the pumping exhaust system; performing the substrate treatment process on the substrate in the processing chamber; evacuating reactants from the processing chamber using the pumping exhaust system. The method includes, after the substrate treatment process, supplying cleaning plasma including cleaning gas in the processing chamber during a cleaning process; and supplying the inert dilution gas at a second flow rate that is less than the first flow rate to the pumping exhaust system during the cleaning process.

12 Claims, 4 Drawing Sheets

(51) Int. Cl.
  *C23C 16/50* (2006.01)
  *C23C 16/505* (2006.01)
  *H01L 21/02* (2006.01)

(52) U.S. Cl.
  CPC ........ *C23C 16/45536* (2013.01); *C23C 16/50* (2013.01); *C23C 16/505* (2013.01); *H01L 21/02208* (2013.01); *H01L 21/02274* (2013.01); *H01L 21/0228* (2013.01)

(56) References Cited

U.S. PATENT DOCUMENTS

| | | | |
|---|---|---|---|
| 6,187,072 | B1 | 2/2001 | Cheung et al. |
| 6,193,802 | B1 | 2/2001 | Pang et al. |
| 6,194,628 | B1 | 2/2001 | Pang et al. |
| 6,255,222 | B1 | 7/2001 | Xia et al. |
| 6,516,913 | B1 | 2/2003 | Hartel et al. |
| 6,517,913 | B1 | 2/2003 | Cheung et al. |
| 6,821,572 | B2 | 11/2004 | Moon et al. |
| 8,657,942 | B2 | 2/2014 | Shaw et al. |
| 9,230,780 | B2 | 1/2016 | Cox et al. |
| 9,240,308 | B2 | 1/2016 | Cox et al. |
| 9,625,168 | B2 | 4/2017 | Shinohara et al. |
| 11,332,824 | B2 * | 5/2022 | Xavier .................. C23C 16/505 |
| 2001/0015133 | A1 * | 8/2001 | Sakai .................. C23C 16/4412 96/372 |
| 2003/0097985 | A1 | 5/2003 | Kitazawa |
| 2003/0219361 | A1 | 11/2003 | Lee et al. |
| 2004/0255854 | A1 | 12/2004 | Sakai et al. |
| 2005/0011445 | A1 | 1/2005 | Upham |
| 2006/0246217 | A1 * | 11/2006 | Weidman .......... H01L 21/76889 427/443.1 |
| 2006/0249077 | A1 | 11/2006 | Kim et al. |
| 2007/0267143 | A1 | 11/2007 | Carlson |
| 2008/0081130 | A1 | 4/2008 | Farnia et al. |
| 2008/0310975 | A1 | 12/2008 | Chandler et al. |
| 2009/0017206 | A1 | 1/2009 | Clark et al. |
| 2009/0075490 | A1 | 3/2009 | Dussarrat |
| 2009/0108413 | A1 | 4/2009 | Ohmi |
| 2010/0119420 | A1 | 5/2010 | Chandler et al. |
| 2013/0139690 | A1 | 6/2013 | Ohuchi et al. |
| 2013/0171919 | A1 | 7/2013 | Shinohara et al. |
| 2013/0237063 | A1 | 9/2013 | Varadarajan et al. |
| 2013/0240478 | A1 | 9/2013 | Sanchez et al. |
| 2013/0295297 | A1 | 11/2013 | Chou et al. |
| 2014/0045278 | A1 | 2/2014 | Yoshida et al. |
| 2014/0291139 | A1 | 10/2014 | Dickinson et al. |
| 2015/0187567 | A1 | 7/2015 | Ashihara et al. |
| 2017/0098556 | A1 | 4/2017 | Chandrasekharan et al. |
| 2017/0304877 | A1 | 10/2017 | Hilkene et al. |

FOREIGN PATENT DOCUMENTS

| | | |
|---|---|---|
| KR | 20100061733 A | 6/2010 |
| KR | 20140015245 A | 2/2014 |

* cited by examiner

SYSTEMS AND METHODS FOR REDUCING EFFLUENT BUILD-UP IN A PUMPING EXHAUST SYSTEM

CROSS-REFERENCE TO RELATED APPLICATIONS

The present disclosure is a continuation of U.S. patent application Ser. No. 15/263,838 filed on Sep. 13, 2016, now U.S. Pat. No. 11,332,824, issued May 17, 2022. The entire disclosure of the application referenced above is incorporated herein by reference.

FIELD

The present disclosure relates to substrate processing systems, and more particularly to pumping exhaust systems of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform substrate treatment such as deposition or etching of film on a substrate. Substrate processing systems typically include a processing chamber with a substrate support (such as a pedestal, a chuck, a plate, etc.) arranged therein. A substrate such as a semiconductor wafer is arranged on the substrate support during treatment. A gas diffusion device such as a showerhead may be arranged in the processing chamber to deliver and disburse process gases and purge gases as needed.

In some applications, the film is deposited using plasma-enhanced chemical vapor deposition (PECVD) or plasma-enhanced atomic layer deposition (PEALD). During PEALD, one or more cycles are performed to deposit film on the substrate. Each PEALD cycle typically includes precursor dose, dose purge, RF plasma dose, and RF purge steps. During deposition, process gas may be delivered to the processing chamber using the showerhead. During RF plasma dosing, RF power is supplied to the showerhead and the substrate support is grounded (or vice versa).

Evacuation of reactants may be performed using reduced pressure pumping through an exhaust connector that is connected to an inlet of a downstream pump. An outlet of the downstream pump is input to an abatement device that typically includes a gas burner and a water scrubber. An output of the abatement device is usually connected to a facility scrubbed exhaust system.

Some process gas combinations form solid effluent buildup in exhaust lines of the pumping exhaust system. To prevent solid effluent buildup, heated inert dilution gas is injected into the pumping exhaust system and the pump and/or exhaust lines are heated to prevent condensation. Over time, however, the exhaust lines connecting the processing chamber, the downstream pump and the abatement device become increasingly blocked due to effluent buildup. As a result, the process may not perform as intended and defects may increase due to the reduced exhaust flow rate. Eventually, the exhaust lines become sufficiently blocked such that the processing chamber needs to be taken off line and the exhaust lines need to be replaced or otherwise repaired.

Some process gas combinations such as silicon precursor and oxidizer may be more reactive at higher temperatures and pressures. Therefore, the approach of reducing buildup in the exhaust lines by heating up the inert dilution gas, the exhaust lines and the pump to prevent condensation cannot be used due to increased reaction rates.

SUMMARY

A method for reducing effluent buildup in a pumping exhaust system of a substrate processing system includes, during a substrate treatment process, arranging a substrate on a substrate support in a processing chamber; supplying one or more process gases to the processing chamber; supplying an inert dilution gas at a first flow rate to the pumping exhaust system; performing the substrate treatment process on the substrate in the processing chamber; evacuating reactants from the processing chamber using the pumping exhaust system. The method includes, after the substrate treatment process, supplying cleaning plasma including cleaning gas in the processing chamber during a cleaning process; and supplying the inert dilution gas at a second flow rate that is less than the first flow rate to the pumping exhaust system during the cleaning process.

In other features, the pumping exhaust system includes a valve, a pump, an abatement device and exhaust lines connecting the valve to the processing chamber, the pump to the valve, and the abatement device to the pump.

In other features, the inert dilution gas is supplied between at least one of the valve and the pump, and the pump and the abatement device. The substrate treatment process includes one of plasma-enhanced atomic layer deposition and plasma-enhanced chemical vapor deposition. The one or more process gases include precursor gas, an oxidizer gas and an inert gas. The precursor gas includes silicon precursor gas. The oxidizer gas is selected from a group including molecular oxygen and nitrous oxide. The inert dilution gas includes molecular nitrogen.

In other features, the pumping exhaust system includes a pump with a resistive heater. During the clean process, the resistive heater is not activated.

In other features, the process gas includes a precursor gas and an oxidizer gas. The first flow rate is greater than a first predetermined flow rate that is sufficient to prevent combustion of the precursor gas and the oxidizer gas in the pumping exhaust system. The second flow rate is at a second predetermined flow rate that would be insufficient to prevent combustion of the precursor gas and the oxidizer gas if used during the substrate treatment process. The first flow rate is greater than or equal to twice the second flow rate.

In other features, supplying the cleaning plasma includes supplying the cleaning gas to the processing chamber during the cleaning process and striking the cleaning plasma in the processing chamber.

In other features, supplying the cleaning plasma includes remotely generating the cleaning plasma and supplying the cleaning plasma to the processing chamber.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
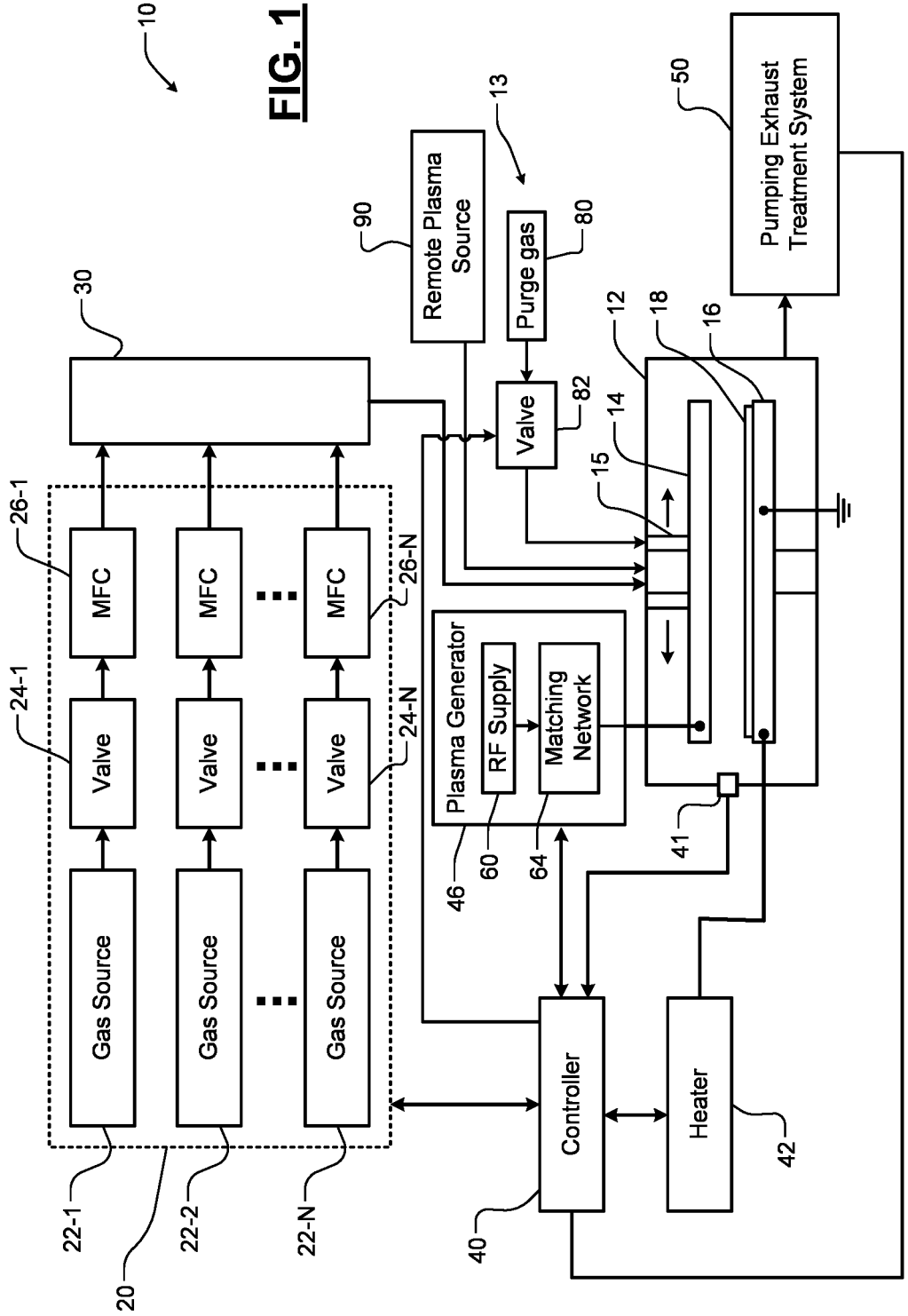
FIG. 1 is a functional block diagram of an example of a substrate processing system including a pumping exhaust system according to the present disclosure.

The pumping exhaust system and method according to the present disclosure is performed after a substrate treatment process. For example, the substrate treatment process may include film deposition using a plasma-enhanced atomic layer deposition (PEALD) process, a plasma-enhanced chemical vapor deposition (PECVD) process, low pressure CVD (LPCVD), furnace ALD, furnace deposition, thermal ALD, or other substrate treatment process. While film deposition is described herein, other types of substrate treatment can be performed. The film deposition is performed using process gases. In some examples, the process gases include one or more precursor gases, an oxidizer and a carrier gas, although other process gases can be used.

As described above, over time solid effluent builds up in the pump and the exhaust lines of the pumping exhaust system. To reduce buildup of effluent during film deposition, the inert dilution gas is typically supplied to the pumping exhaust system to reduce partial pressures of the reactants in the exhaust lines. In some examples, the inert dilution gas is supplied at a first flow rate that is greater than a predetermined flow rate that is sufficient to prevent combustion in the exhaust lines given the flowrates, the precursor type, and the oxidizer type that are used.

When using deposition process gases including certain precursor and oxidizer gases, a resistive heater of the pump is not used during deposition to reduce the likelihood of reaction. In some examples, cooling of the pump is also performed using a pump cooling system.

After substrate treatment, inner surfaces of the processing chamber are cleaned using a cleaning process. The cleaning process uses RF plasma gas including a fluorine-based gas species to remove film buildup on the inner surfaces of the processing chamber. In prior systems, the dilution gas flow rate is maintained at the same flow rate in the pumping exhaust system during both the deposition process and the cleaning process.

According to the present disclosure, a second flow rate of the inert dilution gas that is supplied to the pumping exhaust system is reduced during the cleaning process below the first flow rate used during the deposition process. Because the second flow rate is reduced, a residence time and partial pressure of activated fluorine gas species is increased in the exhaust lines of the pumping exhaust system. As a result, solid effluent in the exhaust lines is etched during the cleaning process.

More particularly, during substrate treatment, the inert dilution gas is flowed at the first flow rate in order to reduce the partial pressures of the reactants in the exhaust lines. In some examples, the first flow rate is greater than a predetermined flow rate that is sufficient to prevent combustion in the exhaust lines given the flowrates, the precursor type and the oxidizer type that are used. In some examples, the inert dilution gas is provided at a flow rate in a range from 100 standard liters per minute (slm) to 300 slm. For example, 190 slm may be used.

In some examples, the second flow rate of the inert dilution gas is less than the first flow rate. In some examples, the second flow rate used during the cleaning process would be insufficient to prevent combustion had it been used during the substrate treatment process. In some examples, the second flow rate is in a range 10 to 90 slm during the cleaning process, although other flow rates can be used.

Referring now to FIG. 1, an example of a substrate processing system 10 includes a processing chamber 12 with a reaction volume. While a specific processing chamber example is shown, other types of processes and/or processing chambers may be used. Process gases may be supplied to the processing chamber 12 using a showerhead 14. In some examples, the showerhead 14 is a chandelier-type showerhead. A secondary purge gas system 13 may be used to inject secondary purge gas between an upper surface of the showerhead 14 and a top surface of the processing chamber 12. The secondary purge gas system 13 may include a collar 15 that is arranged around a stem of the showerhead and that includes gas holes (not shown) for injecting secondary purge gas laterally between the showerhead 14 and a top surface of the processing chamber 12.

A substrate 18 such as a semiconductor wafer may be arranged on a substrate support 16 during processing. The substrate support 16 may include a pedestal, an electrostatic chuck, a mechanical chuck or other type of substrate support.

A gas delivery system 20 may include one or more gas sources 22-1, 22-2, . . . , and 22-N (collectively gas sources 22), where N is an integer greater than one. Valves 24-1, 24-2, . . . , and 24-N (collectively valves 24), mass flow controllers 26-1, 26-2, . . . , and 26-N (collectively mass flow controllers 26), or other flow control devices may be used to controllably supply one or more gases to a manifold 30, which supplies a gas mixture to the processing chamber 12.

A controller 40 may be used to monitor process parameters such as temperature, pressure etc. (using one or more sensors 41) and to control process timing. The controller 40 may be used to control process devices such as the gas delivery system 20, a substrate support heater 42, and/or an RF plasma generator 46. The controller 40 may also be used to evacuate reactants from the processing chamber 12 using a pumping exhaust system 50.

The RF plasma generator 46 selectively generates the RF plasma in the processing chamber. The RF plasma generator 46 may be an inductive or capacitive-type RF plasma generator. In some examples, the RF plasma generator 46 may include an RF supply 60 and a matching and distribution network 64. While the RF plasma generator 46 is shown connected to the showerhead 14 and the substrate support is grounded or floating, the RF plasma generator 46 can be connected to the substrate support 16 and the showerhead 14 can be grounded or floating. In some examples, purge gas 80 may be selectively supplied to the secondary purge gas system 13 by a valve 82.

During cleaning, a cleaning plasma process gas may be supplied to the processing chamber and plasma may be struck in the chamber as described above. Alternately, a remote plasma source 90 may be used to supply cleaning plasma to the processing chamber. In some examples, the cleaning plasma process gas or remote cleaning plasma may include a fluorine gas species such as nitrogen trifluoride ($NF_3$), hexafluoroethane ($C_2F_6$), or other fluorine gas species.

Figure 2:
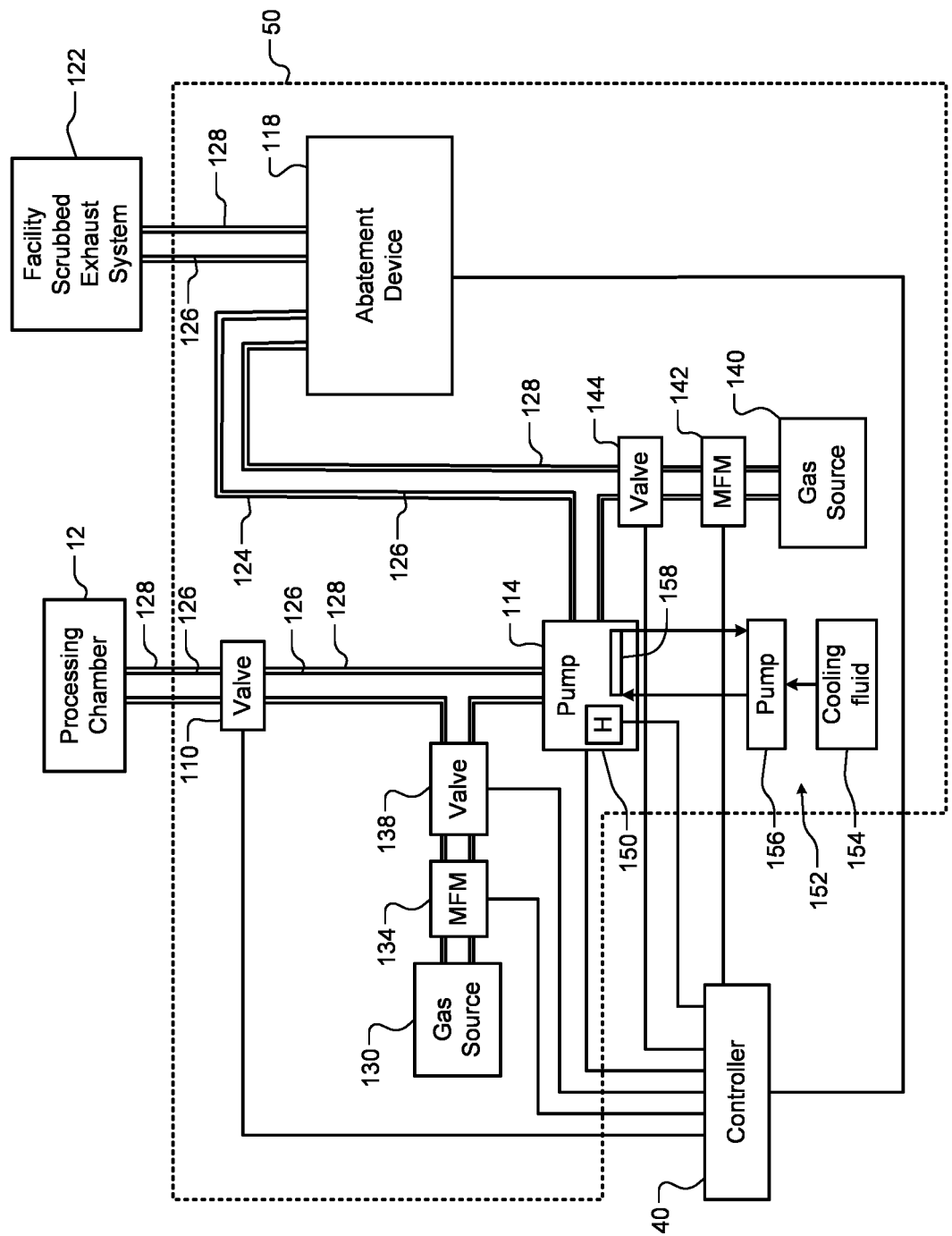
FIG. 2 is a functional block diagram of an example of the pumping exhaust system according to the present disclosure.

Referring now to FIG. 2, the pumping exhaust system 50 is shown in further detail. The pumping exhaust system 50 includes a valve 110, a pump 114 and an abatement device 118. In some examples, the valve 110 includes a throttle valve, although other types of values may be used. An output of the abatement device 118 is in fluid communication with a facility scrubbed exhaust system 122. In some examples, the abatement device 118 includes a gas burner for igniting reactants and a scrubber such as a water scrubber (both not shown). In some examples, exhaust lines 126 connecting the processing chamber, the valve 110, the pump 114, the abatement device 118, and the facility scrubbed exhaust system 122 are heated by a heater 128 to prevent condensation in the exhaust lines 126. In some examples, the exhaust lines 126 are heated to a temperature range between 90 and 110° C. In some examples, the heater 128 includes a resistive heat wrap arranged around the exhaust lines 126.

During deposition and/or cleaning, an inert dilution gas may be injected into the exhaust lines between the valve 110 and the pump 114 and/or between the pump 114 and the abatement device 118. The locations at which the inert gas is injected may depend in part upon the capacity of the pump 114. In some examples when the pump 114 can handle the flow rate of gases from the processing chamber 12 and the additional inert dilution gas to be injected, the inert dilution gas is only injected between the valve 110 and the pump 114 and is not injected between the pump 114 and the abatement device 118.

In implementations where the inert dilution gas is injected between the valve 110 and the pump 114, a mass flow meter 134 and a valve 138 are used to control flow of the inert dilution gas from a gas source 130. In some examples, a direction that the inert dilution gas is injected is in the same direction as the flow in the lines 126 between the valve 110 and the pump 114 (rather than at a right angle as shown). In implementations where the inert gas is injected between the pump 114 and the abatement device 118, a mass flow meter 142 and a valve 144 are used to control flow of the inert dilution gas from a gas source 140. In some examples, a direction that the inert dilution gas is injected is in the same direction as the flow in the lines 126 between the pump 114 and the abatement device 118, although other directions may be used.

In some examples, the pump 114 includes a resistive heater 150 for heating reactants and inert dilution gas flowing through the pump 114. In some examples, the pump includes a cooling system 152 that supplies cooling fluid 154 to a cooling channel 158 using a pump 156. The cooling system 152 may be used to cool reactant gases and inert dilution gas flowing through the pump 114.

Figure 3:
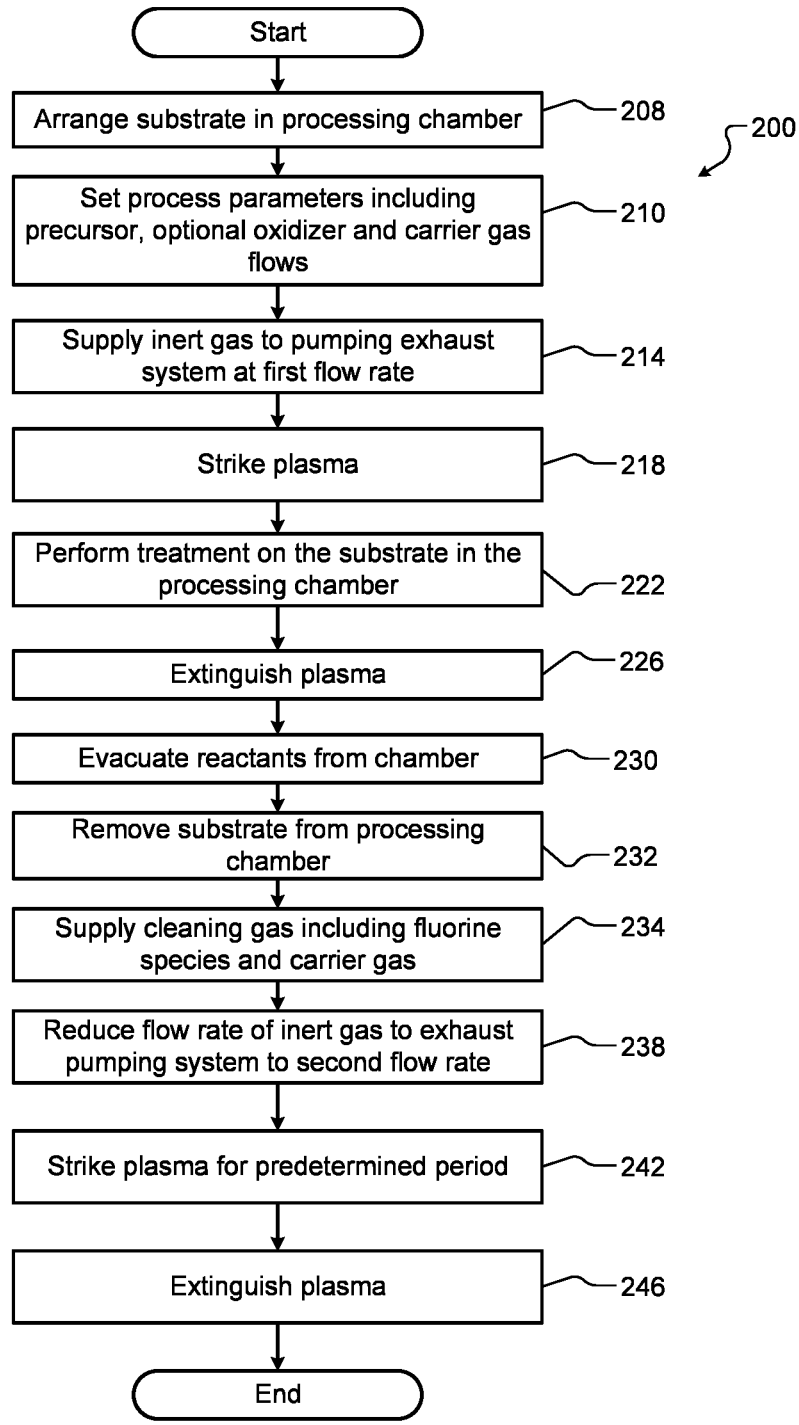
FIG. 3 is a flowchart illustrating a method for operating the pumping exhaust system according to the present disclosure.

Referring now to FIG. 3, a method 200 for removing effluent buildup in the pumping exhaust system 50 is shown. At 208, a substrate is arranged in the processing chamber 12 on the substrate support 16. At 210, process parameters including process gas flows are set. For example, precursor gas flow, optional oxidizer gas flow and carrier gas flow are set by the gas delivery system 20 and the controller 40. At 214, an inert dilution gas is supplied to the pumping exhaust system at the first flow rate. At 218, RF plasma is struck in the processing chamber. At 222, the substrate is treated. For example, film is deposited on the substrate in the processing chamber during a deposition period. At 226, the plasma is extinguished after the deposition period. At 230, reactant gases are evacuated from the chamber. For example, a purge process may be performed by supplying an inert dilution gas to the processing chamber. At 232, the substrate is removed.

At 234, cleaning gas is supplied to the processing chamber. In some examples, the cleaning gas includes a fluorine gas species and a carrier gas. At 238, a flow rate of the inert dilution gas to the pumping exhaust system is reduced to the second flow rate that is lower than the first flow rate. At 242, RF plasma is struck in the processing chamber. At 246, the RF plasma is extinguished after a predetermined cleaning period.

Figure 4:
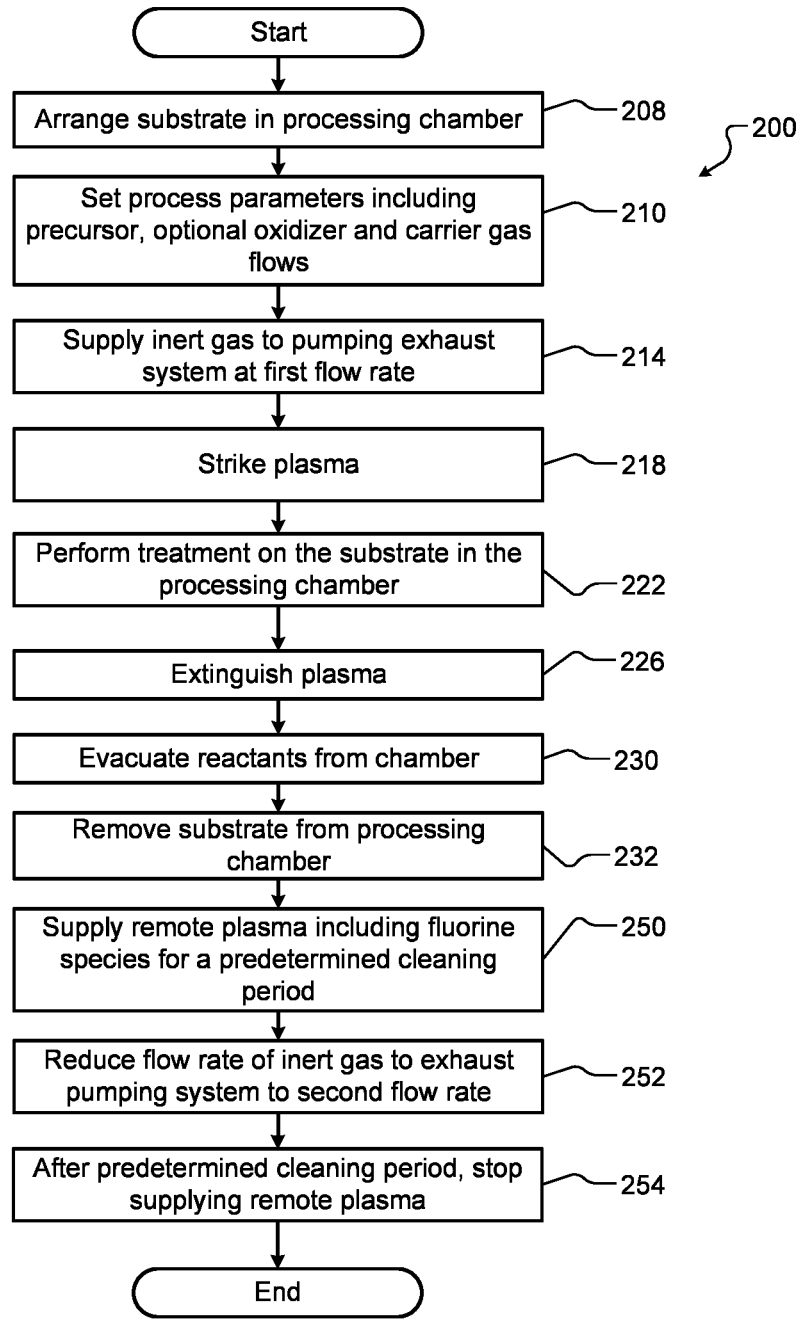
FIG. 4 is a flowchart illustrating a method for operating the pumping exhaust system using a remote plasma source during cleaning according to the present disclosure.

Referring now to FIG. 4, the method of FIG. 3 can be modified using a remote plasma source. After 232, remote plasma including a fluorine species is supplied to the processing chamber for a predetermined cleaning period at 250. Before the cleaning process or while the cleaning process is performed, the flow rate of inert dilution gas to the pumping exhaust system is reduced to the second flow rate at 252. When the predetermined cleaning period is up, the supply of remote plasma from the remote plasma source is stopped at 254.

In some examples, the gas delivery system delivers a process gas mixture including a precursor, an oxidizer and one or more carrier gases. In some examples, the precursor gas includes a silicon precursor gas. In some examples, the oxidizer gas includes nitrous oxide ($N_2O$) or molecular oxygen ($O_2$) and the carrier gas includes argon (Ar), although other oxidizers and carrier gases may be used. In some examples, the cleaning gas may include a fluorine gas species such as nitrogen trifluoride ($NF_3$), hexafluoroethane ($C_2F_6$), or other fluorine gas species. In some examples, the inert dilution gas supplied to the pumping exhaust system includes molecular nitrogen ($N_2$), although other inert dilution gases may be used.

In some examples during wafer processing, the inert dilution gas has a flow rate in a range 100 to 300 standard liters per minute (slm) to reduce the partial pressure of reactants in the exhaust lines. In some examples, the inert dilution gas has a flow rate in a range from 150 to 250 slm during wafer processing. In some examples, the inert dilution gas has a flow rate in a range 170 to 210 slm during wafer processing. In some examples, the inert dilution gas has a flow rate of 190 slm during wafer processing.

In some examples, the inert dilution gas has a flow rate in a range 10 to 90 standard liters per minute (slm) to increase a residence time of the fluorine gas in the lines 126 of the pumping exhaust system 50 during RF plasma cleaning. In some examples, the inert dilution gas has a flow rate in a range 30 to 70 slm during RF plasma cleaning. In some examples, the inert dilution gas has a flow rate in a range 10 to 30 slm during RF plasma cleaning. In some examples, the inert dilution gas has a flow rate in a range from 60 to 70 slm during RF plasma cleaning. In some examples, the first flow rate is greater than or equal to twice the second flow rate. In some examples, the first flow rate is greater than or equal to three times the second flow rate.

In some examples, the systems and methods according to the present disclosure also reduce pump and inert dilution gas temperatures during RF plasma cleaning of the processing chamber to reduce the reaction rate. This serves to increase partial pressure and residence time of the cleaning gas and reactive fluorine components in the pumping exhaust system. In some examples, the inert dilution gas is heated during compression by the pump. In some examples, additional heat is supplied by the resistive heater 150 during deposition. In some examples, the resistive heater 150 is turned off during the cleaning process and/or the cooling system 152 is used to further cool the inert dilution gas during RF plasma clean.

In some examples, the controller 40 initiates the decrease in the flow rate of the inert dilution gas when the cleaning gas is supplied. For example, when the cleaning gas (such as $NF_3$) is supplied, the signal can be used to switch the inert dilution gas from the first or higher flow rate for deposition (such as 150 slm, 190 slm, or 210 slm) to the second or lower flow rate for cleaning (such as 10 slm, 20 slm, 65 slm, etc.).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for reducing effluent buildup in a pumping exhaust system of a substrate processing system, the method comprising:

during a substrate treatment process:
arranging a substrate on a substrate support in a processing chamber;
supplying one or more process gases to the processing chamber, wherein the one or more process gases include a precursor gas and an oxidizer gas;
supplying only an inert dilution gas to the pumping exhaust system, the inert dilution gas being supplied at a first flow rate, wherein the first flow rate is greater than a first predetermined flow rate that is sufficient to prevent combustion of the precursor gas and the oxidizer gas in the pumping exhaust system;
performing the substrate treatment process on the substrate in the processing chamber; and
evacuating substances from the processing chamber using the pumping exhaust system; and after the substrate treatment process:
supplying cleaning plasma including cleaning gas in the processing chamber during a cleaning process for reducing effluent buildup in the pumping exhaust system of the substrate processing system; and
supplying only the inert dilution gas to the pumping exhaust system during the cleaning process, the inert dilution gas being supplied at a second flow rate that is less than the first flow rate, wherein the second flow rate is at a second predetermined flow rate that would be insufficient to prevent combustion of the precursor gas and the oxidizer gas if used during the substrate treatment process.

2. The method of claim 1, wherein the pumping exhaust system includes a valve, a pump, an abatement device, and exhaust lines connecting the valve to the processing chamber, the pump to the valve, and the abatement device to the pump, the method further comprising supplying the inert dilution gas between at least one of the valve and the pump, and the pump and the abatement device.

3. The method of claim 1, wherein the substrate treatment process includes one of plasma-enhanced atomic layer deposition and plasma-enhanced chemical vapor deposition.

4. The method of claim 1, wherein the one or more process gases include the precursor gas, the oxidizer gas, and a carrier gas.

5. The method of claim 4, wherein the precursor gas includes silicon precursor gas.

6. The method of claim 4, wherein the oxidizer gas is selected from a group including molecular oxygen and nitrous oxide.

7. The method of claim 1, wherein the inert dilution gas includes molecular nitrogen.

8. The method of claim 1, wherein the pumping exhaust system includes a pump having a resistive heater to heat the substances and the inert dilution gas flowing through the pump, the method further comprising not activating the resistive heater during the cleaning process.

9. The method of claim 1, wherein the first flow rate is greater than or equal to twice the second flow rate.

10. The method of claim 1, wherein supplying the cleaning plasma includes:
supplying the cleaning gas to the processing chamber during the cleaning process; and
striking the cleaning plasma in the processing chamber.

11. The method of claim 1, wherein supplying the cleaning plasma includes:
remotely generating the cleaning plasma; and
supplying the cleaning plasma to the processing chamber.

12. The method of claim 2, further comprising heating the exhaust lines during the cleaning process.

* * * * *